United States Patent [19]
Mendenhall et al.

[11] Patent Number: 4,899,099
[45] Date of Patent: Feb. 6, 1990

[54] FLEX DOT WAFER PROBE

[75] Inventors: David W. Mendenhall, Greenville; Jay T. Goff, Cranston, both of R.I.

[73] Assignee: Augat Inc., Attleboro, Mass.

[21] Appl. No.: 196,048

[22] Filed: May 19, 1988

[51] Int. Cl.[4] .......................... G01R 1/02; G01R 1/04
[52] U.S. Cl. ............................... 324/158 F; 324/72.5; 324/158 P
[58] Field of Search .............. 324/158 P, 158 F, 73 R, 324/72.5, 73 PC

[56] References Cited

U.S. PATENT DOCUMENTS

| | | | |
|---|---|---|---|
| Re. 31,114 | 12/1982 | Berg | 339/17 CF |
| 3,832,632 | 8/1974 | Ardezzone | 324/158 P |
| 4,065,717 | 12/1977 | Kattner et al. | 324/158 P |
| 4,125,310 | 11/1978 | Reardon, II et al. | 339/92 M |
| 4,382,228 | 5/1983 | Evans | 324/158 F |
| 4,453,795 | 6/1984 | Moulin | 339/92 M |
| 4,518,914 | 6/1985 | Okubo et al. | 324/158 F |
| 4,523,144 | 6/1985 | Okubo et al. | 324/158 P |
| 4,567,433 | 1/1986 | Ohkubo et al. | 324/158 F |
| 4,585,727 | 4/1986 | Reams | 430/312 |
| 4,593,243 | 6/1986 | Lao et al. | 324/158 P |
| 4,614,432 | 9/1986 | Kuniyoshi et al. | 356/401 |
| 4,636,722 | 1/1987 | Ardezzone | 324/158 P |
| 4,643,579 | 2/1987 | Joriumi et al. | 356/401 |
| 4,755,750 | 7/1988 | Leuochner | 356/401 |
| 4,758,785 | 7/1988 | Rath | 324/158 F |
| 4,782,289 | 11/1988 | Schwar et al. | 324/158 F |

FOREIGN PATENT DOCUMENTS

| | | | |
|---|---|---|---|
| 2571861 | 4/1986 | France | 324/158 F |
| 0097580 | 5/1986 | Japan | 324/158 F |

Primary Examiner—Ernest F. Karlsen
Assistant Examiner—W. Burns
Attorney, Agent, or Firm—Weingarten, Schurgin, Gagnebin & Hayes

[57] ABSTRACT

A flex dot wafer probe having utility as an electrical interface between semiconductor wafers and electronic test systems for determining the electrical integrity and performance of integrated circuits. The wafer probe comprises a wafer probe head having a preformed resilient, bendable, formable film mounted on a support member for flexible movement. The wafer probe head is integrated with a probe board which interfaces with an external test system. Wafer contact pads and protrusions are formed on the film in "mirror-image" patterns corresponding to the contact elements of the integrated circuits and interface contact pads of the probe board, respectively. Coplanar line conductors, formed to control the characteristic impedance of the wafer probe head, provide electrical continuity between the wafer contact pads and the protrusions. The conductive protrusions formed on the wafer contact pads and the film physically and electrically engage the contact elements of the integrated circuits and the probe board, respectively, thereby providing electrical paths for test signals between the external test system and the integrated circuits. The flexible configuration of the wafer probe head ensures that all protrusions are forcibly urged into physical and electrical engagement with the corresponding external contact elements at an acceptable force level which precludes deformation of the protrusions.

19 Claims, 5 Drawing Sheets

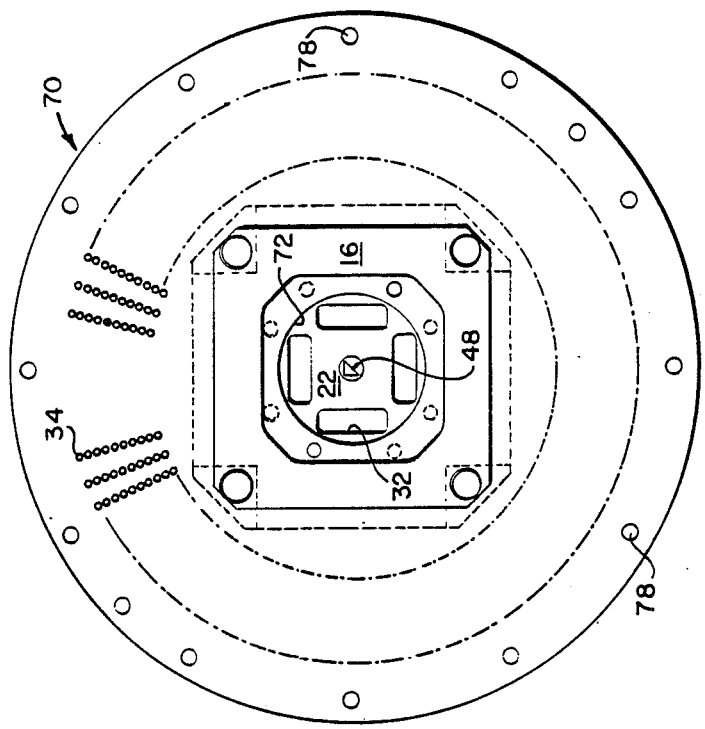
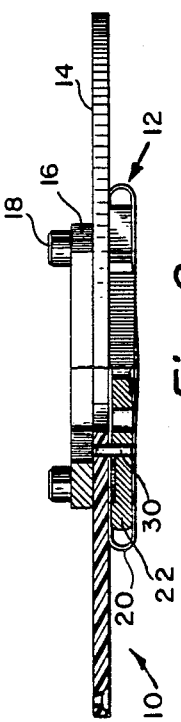
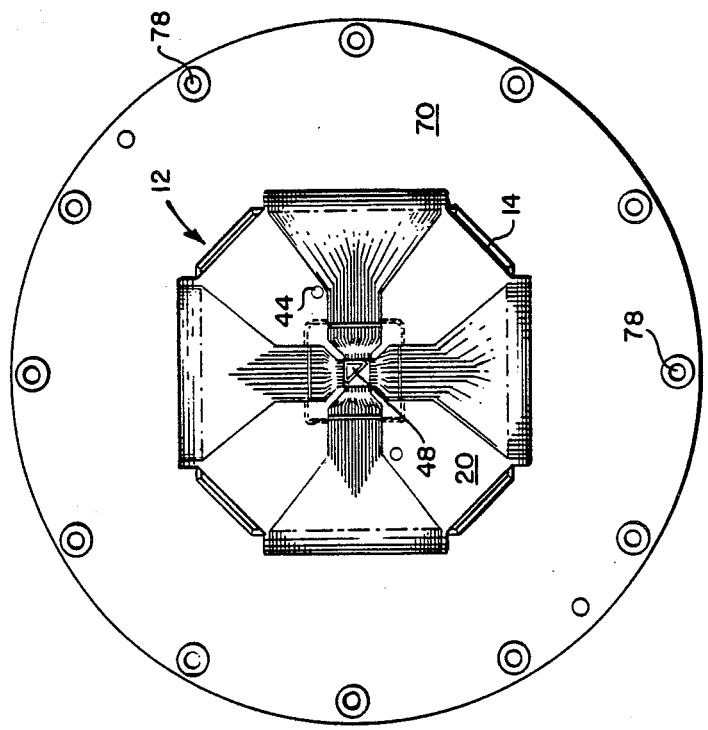

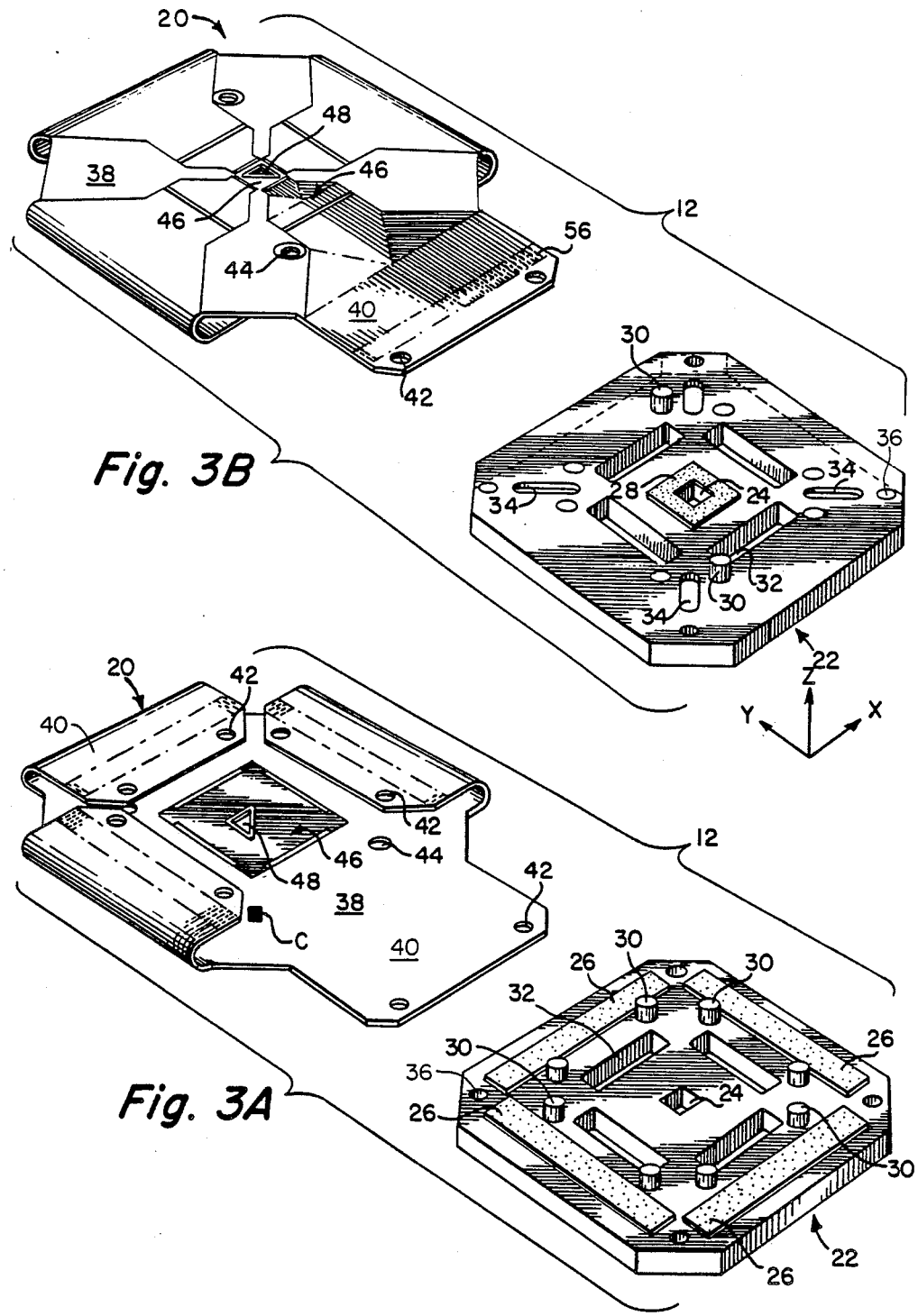

FLEX DOT WAFER PROBE

FIELD OF THE INVENTION

This invention relates to semiconductor wafer probes and method for use thereof, and more particularly to a flexible probe for use in probe systems for integrated testing of the electrical integrity and performance of semiconductor wafers.

BACKGROUND OF THE INVENTION

High density integrated circuits including monolithic circuits and ultra high-speed digital circuits are produced by forming a plurality of integrated circuits on semiconductor wafers. Prior to subdividing the semiconductor wafer into individual circuit chips, die or devices, each chip/die/device should be functionally tested to identify defective circuits. In testing integrated circuits, one objective is the attainment of an accurate representation of the circuit parameters and performance under operational conditions. Ideally, the apparatus and method should be conducive to high frequency/high speed testing, simple to fabricate, durable and require minimal packaging and fixturing for testing.

To ensure an accurate representation of individual element parameters and performance of the interconnected circuit elements, an effective probe system engages the contact elements of the IC chip to be tested, which lie in approximately the same plane, to ensure proper engagement therebetween for reliable and repeatable electrical test signal propagation. A planarized probe system with mirror-imaged contact elements ensures an acceptable level of engagement force between the probe system contact elements and the contact elements of the IC chips, one wherein physical damage to the contact pads and/or the underlying semiconductor substrate is minimized and deformation of the wafer probe elements is effectively eliminated.

A semiconductor wafer testing scheme typically used in the industry is exemplified in FIG. 1. Individual integrated circuits, i.e., chips, die or devices, are multiply formed on semiconductor wafers at the first stage. The individual integrated circuits are DC tested for electrical integrity at the second stage. The individual integrated circuits are then packaged in a usable configuration, e.g., mounted in flatpacks or dual in-line packages, in the third stage. The mounted integrated circuits are then performance tested in the final stage. Individual integrated circuits which are defective are rejected at either the second or final stage. Typically, approximately 60-80% of the integrated circuits are acceptable at the second stage and approximately 85% of the packaged integrated circuits are acceptable at the final stage.

It will be appreciated that the above-described wafer testing scheme has several inherent disadvantages. The greatest cost is incurred in packaging integrated circuits at the third stage. As a consequence, packaged integrated circuits rejected at the final stage represent a significant expense. The overall time period for the illustrated testing scheme may run up to twelve weeks. If final stage performance testing reveals that the integrated circuits are being fabricated in a defective manner, feedback to modify the wafer fabrication process at the first stage will be untimely, resulting in the fabrication of semiconductor wafers which must be discarded.

One prior art method employs a plurality of probe needles having tips which physically engage the terminal contact pads of the IC chips to be tested. Representative examples of such prior art are disclosed and illustrated in U.S. Pat. Nos. 4,382,228, 4,518,914, 4,523,144, 4,567,433 and 4,593,243. While needle probe systems are generally an effective means of determining the parameters of low density IC chips, there are several drawbacks which decrease their utility for testing high density IC chips.

First, to ensure that the plurality of needle tips lie in approximately the same plane, the probe needles may require mechanical finishing by sanding or filing to bring the needle tips within the required tolerance range, i.e., degree of planarization. As well as being a time consuming and expensive process, needle tip finishing may also result in damage to the probe assembly itself.

Needle-type probes physically engage contact pads of the IC chips and thus present a likelihood that damage may be sustained by the pads such as by gouging during initial engagement. Further, unevenly applied pressures exerted against the engaged needles and pads may result in contact pressures being transmitted through the pads to the underlying wafer structure, resulting in damage thereto.

Another problem with needle-type probe assemblies is the degree of care, both in terms of time and skill, which must be exercised to ensure that the needles are properly connected to the probe assembly. Additionally, lower limits as to the degree of miniaturization possible in probe needle systems limit the utility of needle-type probes for testing high density IC chips. Further, at high frequencies (1 MHz or greater) it is difficult to control the characteristic impedance between the needles and the line conductors connecting the needles to external test equipment.

Another method for compensating for nonplanarization between devices to be electrically interconnected is to form metallic conducting buttons on one of two arrays of registered contact pads, as disclosed in U.S. Pat. Nos. 4,453,795 and 4,125,310. The registered arrays of contact pads are electrically interconnected by being forced together under pressure. Deviations in planarity among the contact pads are compensated for by corresponding deformations of the metallic buttons and deformation of a compression pad.

One disadvantage of these interconnects is that the contact pads and resilient metallic buttons are formed on rigid substrates. Since the substrates are forced together under pressure by means of external pressure plates, excessive forces may be transmitted by the metallic buttons against the unbuttoned contact pads to cause damage thereto or to the underlying rigid substrate. Additionally, plastic deformation of the metallic buttons can result in electrical discontinuities at the deformation sites, which in a probe system would result in the loss of parameter and/or performance information.

SUMMARY OF THE INVENTION

To overcome the inherent disadvantages of prior art wafer probe systems, the present invention provides a flex dot wafer probe system which may be utilized for both electrical integrity and performance testing of integrated circuits on the semiconductor wafer, that is, at the second stage illustrated by the dotted line of FIG. 1. Only those integrated circuits passing both phases of testing are subsequently packaged for use. This eliminates the costs associated with the rejection of packaged integrated circuits. Moreover, full testing at this point permits timely feedback, typically within several hours, for modification of the fabrication state, virtually eliminating improperly produced semiconductor wafers.

The wafer probe according to the present invention has a configuration which is flexile in the Z-axis to forcibly urge the rounded contact elements or protrusions of the wafer probe into physical and electrical engagement with the contact elements of the IC chip to be tested at an acceptable force level which ensures good electrical continuity while negating possible damage to the contact elements or underlying semiconductor substrate of the IC chips.

The flex dot wafer probe includes a probe board having a plurality of interface contact pads, an orientation aperture and means for electrically integrating the probe board to external test equipment. The wafer probe also includes a wafer probe head adapted to be electrically integrated with the probe board, the wafer probe head including a preformed resilient film mounted on a support member. The support member includes a central aperture aligned with the orientation aperture of the probe board, thereby allowing an unobstructed view of the IC chip to be tested, pressure pads providing resilient engagement support for the film, and alignment pins to ensure that the film is mounted in proper orientation on the support member.

The film is formed from a resilient dielectric material in a flexile configuration which includes a base plane and tabs extending symmetrically or asymmetrically from the base plane to lie approximately planar thereto. Each tab includes alignment orifices adapted for receipt of corresponding alignment pins to ensure proper mounting of the film on the support member. A wafer alignment aperture is formed in the base plane and, in combination with the central aperture and the orientation aperture, provides an unobstructed line-of-sight along the Z-axis through the flex dot wafer probe.

An array of protrusions is formed on each tab in a mirror-image pattern corresponding to the interface contact contact pad pattern of the probe board. The protrusions physically and electrically engage corresponding interface contact pads of the probe board with no deformation. Each array of protrusions is aligned in registration with a corresponding resilient pressure pad of the support member.

Wafer contact pads are formed on the base member about the wafer alignment aperture. The wafer contact pads are formed in a mirror-image pattern corresponding to the pattern of the planar contact elements of the IC chip/chips to be tested. A protrusion is formed on each wafer contact pad and functions to physically and electrically engage the corresponding IC chip contact elements without deformation. Alternatively, where the contact elements of the IC chips to be tested are soldered columns, the protrusions may be eliminated. The rows of wafer contact pads are aligned in registration with a resilient pressure pad.

Coplanar line conductors are formed on the film to provide electrical continuity between the wafer contact pads and the arrays of protrusions formed on the tabs. The coplanar line conductors may be patterned to provide a unique characteristic impedance for the flex dot wafer probe.

The wafer alignment aperture permits the flex dot wafer probe to be readily aligned with the contact elements of the IC chip to be tested. Alignment in the X, Y and directions $\theta$ is effected by utilizing the wafer alignment aperture. Relative micromovement of the flex dot wafer probe with respect to the IC chip to be tested causes the contact elements to be scoured or scrubbed to remove any oxide layer, thereby enhancing the electrical integration of the flex dot wafer probe with the IC chip to be tested.

For wafer testing, the wafer probe head in combination with the probe board is interfaced between the semiconductor wafer and the external electronic testing equipment so that the protrusions of the wafer contact pads physically and electrically engage the IC chip contact elements. The flexile configuration of the flex dot wafer probe ensures that each protrusion is forcibly engaged with its corresponding IC chip contact element at an acceptable level of force, that is a force sufficient to ensure good electrical continuity but which will not damage the interfacing contact elements or underlying semiconductor substrate, to ensure that the flex dot wafer probe maintains electrical continuity between the test equipment and the IC chip to be tested. At the acceptable force level, there is no deformation of the protrusions.

BRIEF DESCRIPTION OF THE DRAWINGS

A more complete understanding of the present invention and the attendant advantages and features thereof will be more readily understood by reference to the following detailed description when considered in conjunction with the accompanying drawing wherein:

FIG. 2 is a cross-sectional view of a flex dot wafer probe according to the present invention;

FIG. 3A is a first exploded perspective of a wafer probe head according to the present invention;

FIG. 3B is second exploded perspective of the wafer probe head of FIG. 3A;

FIG. 6A is a plan view of the major surface of the flex dot wafer probe — annular probe card combination adapted for interfacing with external test equipment; and FIG. 6B is a plan view of the other major surface of the combination of FIG. 6A adapted for interfacing with the IC chip/die/device to be tested.

DETAILED DESCRIPTION OF PREFERRED EMBODIMENTS

Figure 1:
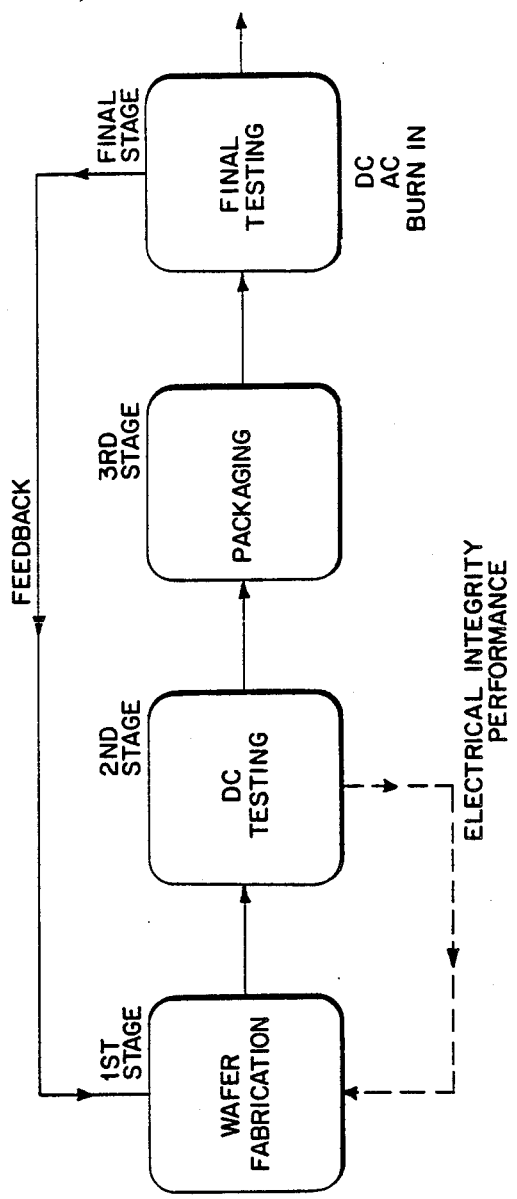
FIG. 1 is a block diagram illustrating a prior art testing scheme for IC chips/die/devices formed on a semiconductor wafer.

Referring now to the drawings wherein like reference numerals designate corresponding or similar elements throughout the several views, there is shown generally in FIG. 2 a cross-sectional view of a flex dot wafer probe 10 according to the present invention.

The flex dot wafer probe 10 comprises a wafer probe head 12, a probe board 14, a strain relief member 16 and assembly screws 18. The assembly screws 18 are inserted through corresponding holes in the strain relief member 16 and the probe board 14 to threadingly engage corresponding threaded insets of the wafer probe head 12. The probe board 14 interfaces with external test equipment (not shown) which would be positioned adjacent the strain relief member 16. The wafer probe head 12 interfaces with the IC chip/die/device to be tested as described more fully hereinbelow.

As used herein, it is to be understood that reference to the IC chip to be tested in general encompasses integrated circuits formed on semiconductor wafers, that is, it includes one or more chips, one or more die or one or more electronic devices or combinations thereof. Chip is used in the singular tense herein only to facilitate the written disclosure, it being understood that the flex dot wafer probe 10 can also be utilized to test multiple chips, die or devices or combinations thereof simultaneously.

The wafer probe head 12, shown in exploded perspective in FIGS. 3A and 3B, comprises a resilient formable film 20 mounted in predetermined alignment on a film support member 22. Referring to FIGS. 3A and 3B, respectively, there are shown perspective views of the major surfaces of the resilient formable film 20 and the support member 22. The support member 22 illustrated in the drawings is an octagonal structure having a length of approximately 2.6 inches at its widest point in both the X and Y directions and is approximately 0.187 inches thick (Z-direction).

The film support member 22, which may be formed from anodized aluminum, includes a central aperture 24, illustrated as rectangular in configuration in FIGS. 3A and 3B, and resilient pressure pads 26, 28, formed from a resilient material such as silicone, disposed on major surfaces thereof, respectively. Four individual pressure pads 26 are disposed on the first major surface in a geometric, usually rectangular, pattern equidistantly about the central aperture 24. A rectangular pressure pad 28 is disposed on the second major surface as shown in FIG. 3B.

Multiple alignment pins 30 project outwardly from the plane of one major surface of the support member 22 as shown in FIG. 3A, with two alignment pins 30 associated with the inner edge of each silicone pressure pad 26 in correspondence with elements of the film 20 as described in greater detail hereinbelow. As exemplarily illustrated in FIG. 3B, two of the alignment pins 30 extend completely through the support member 22 to further facilitate alignment of the film 20 with the support member 22. The alignment pins 30 also facilitate alignment of the wafer probe head 12 to the probe board 14.

Elongated openings 32 are formed through the support member 22 between the central aperture 24 and each pressure pad 26 to permit access to the film 20. Slots 34 are formed in the support member 22 as illustrated in FIG. 3B to provide clearance for decoupling capacitors C formed in the film 20. Threaded insets 36, for coupling the wafer probe head 12 to the probe board 14, are symmetrically formed about the periphery of the support member 22.

Referring to FIGS. 3A and 3B, the exemplary film 20 depicted has a flexile configuration which includes a base plane 38 having interior and exterior surfaces and four tabs 40 having interior and exterior surfaces extending symmetrically therefrom. It is too be understood that the number of tabs 40 may be other than four, that the tabs 40 may be formed in other configurations, and that the tabs 40 may extend asymmetrically from the base plane 38, depending upon the particular application. The tabs 40 extend from the base plane 38 in a U-shaped profile such that the terminal extremities of the tabs 40 lie in a plane approximately parallel to the interior surface of the base plane 38. Two alignment apertures 42 are formed near the extremity of each tab 40 and are sized for reception of corresponding fixed alignment pins 30 depending from the support member 22.

Two additional alignment apertures 44 are formed through the base plane 38, as depicted in FIG. 3A, primarily for aligning the film 20 during the formation thereof. These apertures 44 are sized for reception of the alignment pins 30 depending from the major surface of the support member 22 as shown in FIG. 3B. The flex film 12 as illustrated includes an optional transparent rectangle 46 formed centrally in the base plane 38. The internal surface of the base plane 38 illustrated in FIG. 3A is formed as a metallic ground plane and includes capacitors C, one of which is shown.

A wafer alignment aperture 48, shown in FIGS. 3A and 3B as triangular for purposes of explication, is centrally formed through the transparent rectangle 46 and includes a hypotenuse 50, a first side 52 and a second side 54. It is to be understood that three reference marks, disposed along the sides and at the apex of a right angle, are used for X, Y and $\theta$ alignment of the flex dot wafer probe 10 with the IC chip to be tested. Therefore, it is to be understood that three wafer alignment holes 50', 52', 54', or equivalent elements, could be used in place of the illustrated wafer alignment aperture 48.

The wafer probe head 12 according to the present invention is designed and fabricated so that the first side 52 and the second side 54 have known dimensions, $X_1$ and $Y_1$, respectively. The X and Y locations of the protrusions or wafer contact pads with respect to the first and second sides 52, 54 are also known design parameters. Similarly, the external dimensions of the IC chip to be tested are known parameters, $X_2$ and $Y_2$, specified by the wafer manufacturer. The locations of the contact elements of the IC chip in relation to $X_2$ and $Y_2$ are also known design parameters.

Alignment is accomplished by positioning the first and second sides 52, 54 of the wafer alignment aperture 48 in registration with corresponding edges of the IC chip to be tested. Algebraic equations can be set up using $X_1$, $X_2$, $Y_1$, $Y_2$ and solved to provide the dimensions $\Delta X_3$ and $\Delta Y_3$ by which the wafer probe head 12 must be translated to precisely align the protrusions or wafer contact pads of the wafer probe head 12 with the contact elements of the IC chip to be tested. The wafer probe head 12 may also be rotated through an angle $\theta$, about the apex of the wafer alignment aperture 48, as required to align the contact elements.

The film 20 is fabricated from a resilient dielectric material such that the wafer probe head 12 is flexile in the Z-axis direction. Heat-resistant polymers such as polyimides are a representative dielectric having excellent electrical properties and which are readily formable into thin, bendable flexile films. The film 20 may be formed as a single layer or as multiple layers. The multiple layer configuration would include individual planes for ground, power and signal pathways. Vias would be utilized to electrically interconnect each of the multiple layers with the corresponding protrusions and wafer contact pads.

Figure 4A:
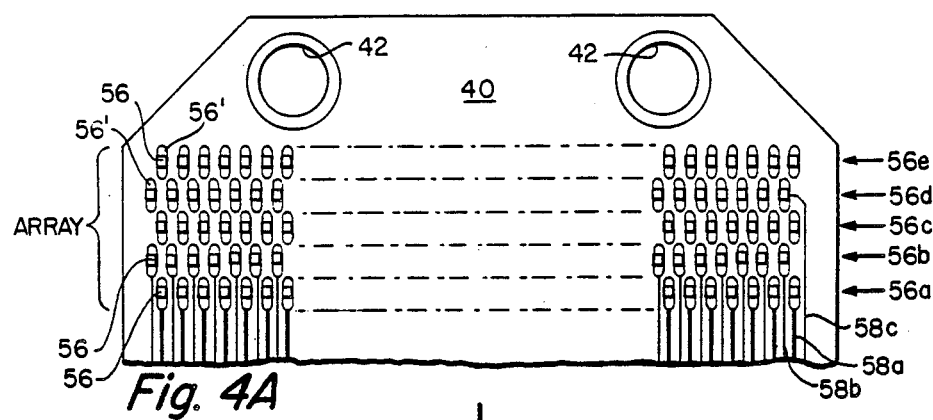
FIG. 4A is a detailed plan view of an array of protrusions/contact pads formed on the terminal end of one tab of the film depicted in FIGS. 3A and 3B.

Referring to the detailed depiction of the terminal extremity of an exemplary tab 40 in FIG. 4A, an array of protrusions 56 is formed thereon in a predetermined pattern. At the present level of forming technology, the protrusions 56 are formed as elevated structures on preformed contact pads 56'. It is preferable, however, to form the protrusions 56 directly on the surface of the film 20.

As illustrated, five rows of protrusions 56a, 56b, 56c, 56d, 56e are arranged in a staggered array pattern representing a ground row, a signal row, a second ground row, a second signal row and a power/ground row, respectively. This pattern is for purposes of illustration only, it being understood that the function and number of rows is a design consideration depending upon the particular application.

The protrusions 56 are formed of an electrically conductive material and extend outwardly from the surface of the tab 40. The protrusions 56 provide electrical continuity with the probe board 14 in a manner further described hereinbelow.

Figure 4B:
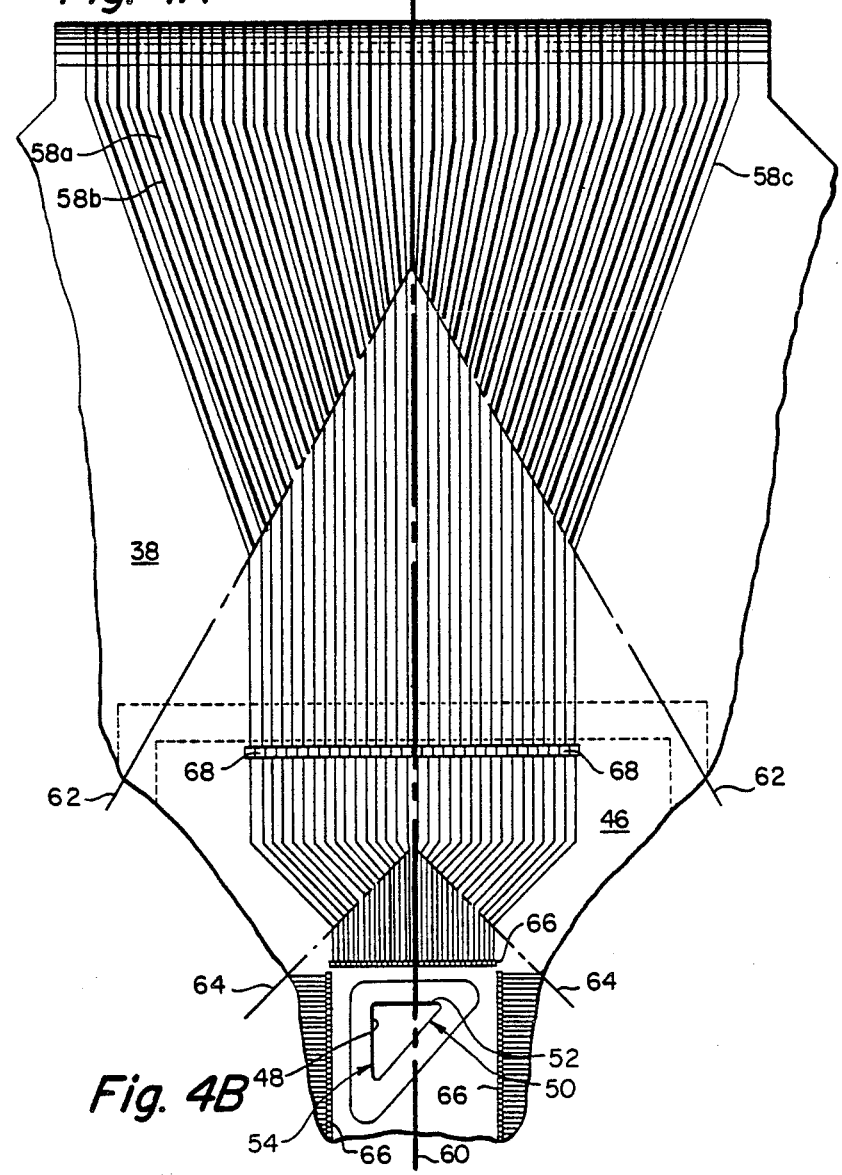
FIG. 4B is a detailed plane view of the coplanar line conductors and wafer contact pads formed on the base plane of the film depicted FIGS. 3A and 3B.

Coplanar line conductors 58 extend from the array of protrusions 56 in a predetermined pattern and terminate on the base plane 38, as shown in FIGS. 4A and 4B. As illustrated in FIG. 4A, coplanar line conductors 58a, 58b, 58c extend in parallel, but only from the first, second and third rows of protrusions 56a, 56b, 56c. It is to be understood that pattern of line conductors 58 depends upon the particular application.

Referring to FIG. 4B, a representative example of a conduction pattern emanating from one tab 40, the coplanar line conductors 58 extending inwardly from the edge of the base plane 38 converge towards a medial line 60 thereof. The coplanar ground line conductors 58a, electrically continuous with the first row of protrusions 56a, converge and terminate along imaginary lines defining first acute angle patterns 62 about corresponding medial lines 60. The coplanar signal line conductors 58b, electrically continuous with the second row of protrusions 56b, converge to the first acute angle pattern 62 and extend inwardly in parallel therefrom.

The coplanar ground line conductors 58a shied corresponding coplanar signal line conductors 58b, thereby preventing signal cross talk between adjacent signal line conductors 58b. The pattern of the line conductors 58, terminating at the first acute angle pattern 62, is a constraint imposed by the present level of forming technology. Preferably, the coplanar ground line conductors 58a would extend inwardly to the proximity of the wafer contact pads 66.

The coplanar signal line conductors 58b, extending inwardly from the acute angle pattern 62, converge again to define a second acute angle pattern 64. The coplanar line conductors 58b extend inwardly in parallel from the second acute angle pattern 64 to terminate in rows of wafer contact pads 66. The wafer contact pads 66 form a predetermined pattern about the wafer alignment aperture 48 which is a mirror-image of the contact elements of the IC chip to be tested.

Protrusions 56 of electrically conductive material may be formed on each wafer contact pad 66 for those applications wherein the IC chip to be tested has only planar contact pads. The protrusions 56 provide the electrical continuity between the wafer contact pads 66 and the contact elements of the IC chip being tested. For IC chips incorporating soldered columns as the contact elements, protrusions are not required on the corresponding wafer contact pads 66 which can directly contact the soldered columns.

The predetermined rectangular pattern of the wafer contact pads 66 illustrated in FIG. 4B is a mirror-image of a typical rectangular edge pattern of contact elements of an IC chip (not shown). The pattern of wafer contact pads 66 can also mirror-image IC chips having a pattern of internally formed contact elements, or a combination of internal/edge contact elements. Alternatively, IC chips may utilize soldered columns depending from the test surface of the chip or die as the contact elements. In this instance, the protrusions 56 are not required, the wafer contact pads 66 electrically and physically contacting the corresponding depending soldered columns.

The arrays of protrusions 56, the coplanar line conductors 58, and the wafer contact pads 66 are formed of electrically conductive material such as electrolytic plated copper by conventional photolithographic methods. The protrusions 56 are formed on the tabs 40 and the wafer contact pads 66 by photolithography, plating or a combination of both methods. The protrusions 56 may additionally be formed with a plating of conductive material having good properties of electrical conduction. The patterning of the coplanar line conductors 58 allows the characteristic impedance of the flex dot wafer probe 10 to be controlled at predetermined values.

Cross-coupling vias 68 may be formed through the coplanar line conductors 58 as shown in FIG. 4B. The cross-coupling vias 68 are formed to be aligned with the elongated openings 32 of the support member 22. This increases the flexibility of the wafer probe head 12 by permitting selected coplanar line conductors 58 to be cross-coupled by soldering of connecting wires therebetween.

The wafer probe head 12 is assembled by placing the support member 22 in contact with the inner surface of the base plane 38 such that the tabs 40 of the film 20 are disposed above the first major surface of the film support member 22 shown in FIG. 3A. A force is exerted against each tab 40 to fit the alignment apertures 42 thereof onto the corresponding alignment pins 30 of the support member 22.

With the film 12 mounted on the support member 22 as described above, the array of protrusions 56 of each tab 40 are disposed in registration with the corresponding pressure pads 26 and the wafer contact pads 66 are disposed in registration with the pressure pad 28. The X and Y sides of the wafer alignment aperture 48 are aligned with corresponding edges of the central aperture 24 of the support member 22. This ensures that an unobstructed line-of-sight exists along the Z-axis through the center of the flex dot wafer probe 10 (perpendicular to the plane of the paper in FIGS. 6A and 6B). The rows of cross-coupling vias 68 depending above from the inner surface of the base plane 38 are aligned within the corresponding elongated openings 32 of the support member 22 to facilitate cross-coupling as described hereinabove.

The wafer probe head 12 is physically mated to an annular probe board 70, illustrated as in FIGS. 6A, 6B which is electrically and physically interconnected to the external testing equipment (not shown). The annular probe board 70 includes an orientation aperture 72, clearance openings 74 and four mating apertures 76. Physical mating between the annular probe board 70 and the wafer probe head 12 is effected by inserting screws 18 through corresponding holes in the strain relief member 16 and the mating apertures 76 to threadingly engage the threaded insets 36 of the support member 22. The alignment pins 30 are slidably received in the clearance openings 74. Fixture apertures 78 located on the periphery of the annular probe board 70 are used to secure the annular probe board 70 — wafer probe head 12 combination to external testing equipment (not shown).

Figure 5:
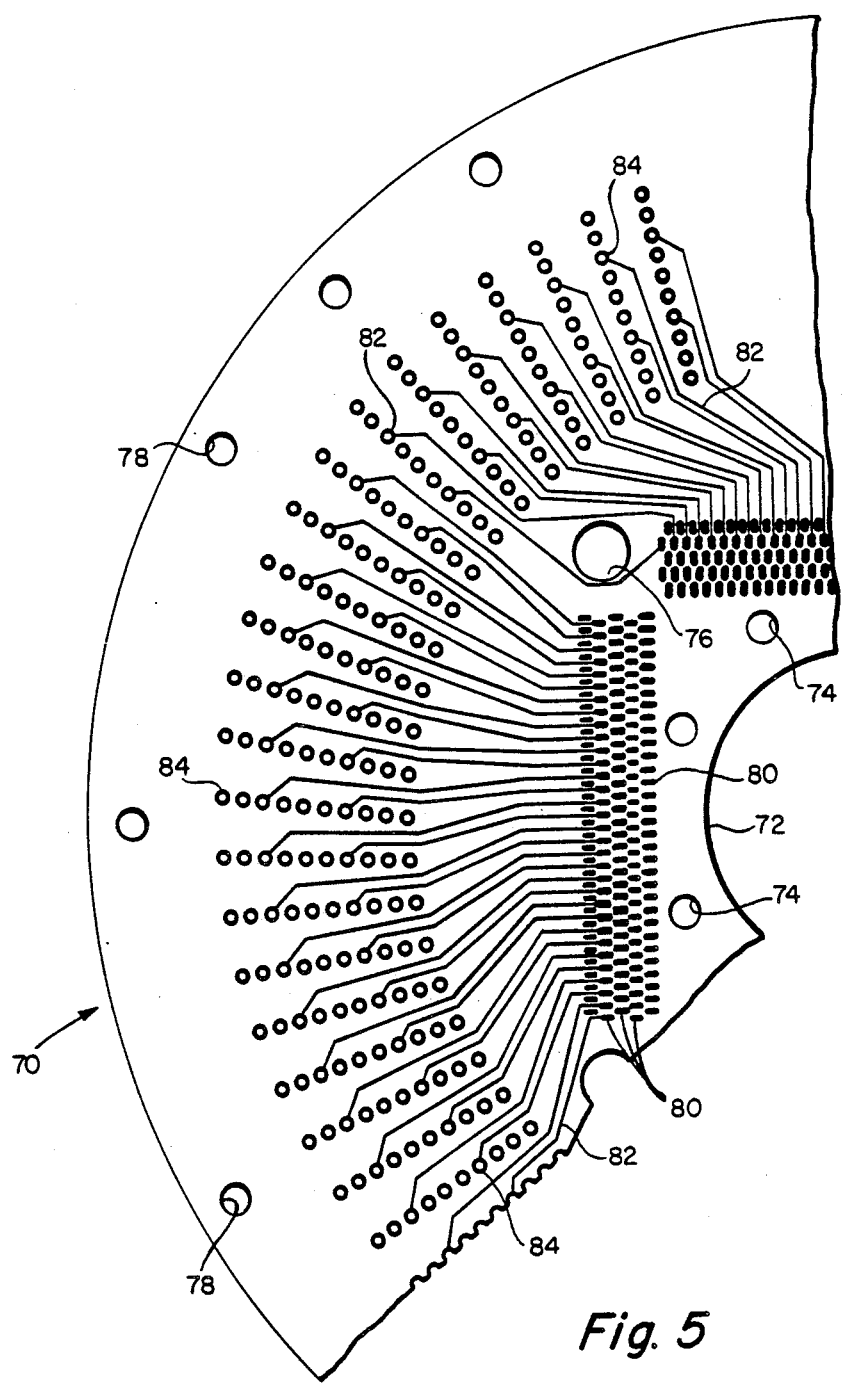
FIG. 5 is a partial plan view of an annular probe board adapted for use in combination with the wafer probe head of FIGS. 3A and 3B to form a flex dot wafer probe according to the present invention.

The annular probe board 70 has four arrays of interface contact pads 80, mirror-images of the protrusion arrays 56 of the wafer probe head 12, formed thereon. The interface contact pads 80 are selectively connected by conductive paths 82 to radial arrays of test equipment contact elements, illustrated in FIG. 5 as plated throughholes 84. The configuration and pattern of the plated throughholes 84 are generally determined by the manufacturer of the test equipment. The conductive paths 82 may be formed in predetermined patterns to provide a unique characteristic impedance for the probe board 70.

The test equipment includes signal transmitting elements such as the spring biased electrical test probes (not shown) described in U.S. Pat. No. 4,636,026, which may be selectively energized to provide electrical signal continuity from the external testing equipment to the plated throughholes 84 of the annular probe board 70. Electrical test signals are transmitted via the conductive paths 82 through the interface contact pads 80 to the annular probe board 70 — wafer probe head 12 combination and to the contact elements of the IC chip being tested. Both electrical integrity and performance of the IC chip may be tested using the above-described flex dot wafer probe 10.

When the wafer probe head 12 is physically mated to the annular probe board 70, as exemplarily illustrated in FIGS. 2A, 6A and 6B, the flexile configuration of the wafer probe head 12, i.e., the film 20 in combination with the pressure pads 26, ensures that the protrusions 56 of the tabs 40 are forcibly urged into engagement with the corresponding interface contact pads 80 with acceptable engaging force to ensure electrical continuity between the wafer probe head 12 and the annular probe board 70.

There is no deformation of the protrusions 56 due to the flexile nature of the film 20 in combination with the resilient pressure pads 26 at the acceptable force level. Since the orientation aperture 72 is coaxial with the central aperture 24 and the wafer alignment aperture 48, see FIGS. 6A and 6B, the IC chip to be tested is visibly positioned along the Z-axis of the combined annular probe board 70 - wafer probe head 12 as described hereinabove.

For testing of semiconductor wafers, the flex dot wafer probe 10 functions as the electrical interface element between the external test equipment and the integrated circuitry formed on the semiconductor wafer. The semiconductor wafers are mounted in a wafer handling apparatus (not shown) so that the IC contact elements are disposed adjacent the wafer contact pads 66 of the flex dot wafer probe 10. For embodiments having protrusions 56 formed on the wafer contact pads 66, the protrusions 56 are disposed adjacent the contact elements of the IC chip to be tested.

Z-axis movement forcibly urges the the wafer contact pads 66 or wafer contact pads 66 with protrusions 56 into physical and electrical engagement with corresponding contact elements of the IC chip to be tested, respectively. The resilient pressure pad 28 permits flexile compression of the member 20 against the support film 22 during Z-axis movement without damage thereto and with no deformation of the protrusions 56.

The protrusions 56 are forcibly urged into physical and electrical engagement with corresponding contact elements at an acceptable force level, that is a force level which ensures good electrical continuity between the flex dot wafer probe 10 and the external test equipment and the IC chip while minimizing possible engagement force damage to the IC contact elements and/or the underlying semiconductor substrate of the IC chips or dies.

Another advantage accruing to the flex dot wafer probe as described hereinabove is that the unobstructed Z-axis line-of-sight provided by the wafer alignment aperture 48 and the central aperture 24 facilitate ready alignment of the IC chip to be tested with the flex dot wafer probe 10 as described hereinabove. And, in addition, with the flex dot wafer probe positioned for testing, relative micromovement of the flex dot wafer probe with respect to the IC chip to be tested effects a scrubbing or scouring action between the protrusions thereof and the IC contact elements. This action effectively removes oxide buildups from the electrical contact elements to enhance the electrical connection therebetween.

While the above written disclosure has been directed to a flex dot wafer probe for use in a probe test system for testing the electrical integrity and performance of semiconductor wafers, it will be appreciated that the flexile configuration of the flex dot wafer probe would also have utility as an electrical interconnect between spaced-apart devices such as adjacent PC boards where deviations in separation distance are expected. For example, the wafer probe could operate as an electrical interface between sets of coplanar printed circuit boards to be electrically integrated where deviations in separation therebetween may occur due to manufacturing tolerances, heat generation, etc.

A variety of modifications and variations of the present invention are possible in light of the above teachings. It is therefore to be understood that within the scope of the appended claims, the present invention may be practiced otherwise than as specifically described hereinabove.

We claim:

1. For use in testing the electrical integrity and performance of at least one integrated circuit formed on a semiconductor wafer, a wafer probe test system including a flex dot wafer probe and external test equipment having signal transmitting elements disposed in a predetermined pattern for providing electrical test signals to test the electrical integrity and performance of each integrated circuit, and wherein each integrated circuit to be tested includes a predetermined pattern of contact elements adapted to receive the electrical test signals, said flex dot wafer probe comprising;

probe board means having test equipment contact elements for electrically interfacing with corresponding signal transmitting elements of the external test equipment, said probe board means further including interface contact pads arranged in a predetermined pattern; and wafer probe head means disposed in combination with said probe board means for interfacing between said probe board means and each integrated circuit to be tested, said wafer probe head means including film means configured for resiliently interfacing between the interface contact pads of said probe board means and the contact elements of each integrated circuit to be tested to provide electrical continuity therebetween for the electrical test signals, said film means configured to include a base plane and at least one tab extending from said base plane in a U-shaped profile such that said at least one tab is approximately parallel to said base plane, and support member means having first and second major surfaces for mounting said film means wherein said base plane of said film means is mounted on said first major surface and each said at least one tab is mounted on said second major surface, said film means further including a plurality of protrusions formed on each said at least one tab of said film means in a mirror-image pattern corresponding to said predetermined pattern of said interface contact pads, said protrusions being forcibly urged into physical and electrical engagement with said interface contact pads in a nondeformable manner to provide electrical continuity therebetween for the electrical test signals, a plurality of wafer contact pads formed on said base planes of said film means in a mirror-image pattern corresponding to the predetermined pattern of the contact elements of each integrated circuit to be tested, said wafer contact pads being forcibly urged into physical and electrical engagement with corresponding contact elements of each integrated circuit to be tested in a scrubbing and nondeformable manner to provide enhanced electrical continuity therebetween for the electrical test signals, and coplanar line conductor means formed on said film means for electrically interconnecting said protrusions to corresponding ones of said wafer contact pads to provide electrical continuity between said probe board means and the integrated circuit chip to be tested wherein electrical test signals from the test equipment are transmitted to said probe board means and to said wafer probe head means via said forcibly engaged interface contact pads and said protrusions, and wherein the electrical test signals are further transmitted from said protrusions via said coplanar line conductor means to said plurality of wafer contact pads and through said forcibly engaged wafer contact pads and the contact elements of the integrated circuit to be tested to the integrated circuit to determine the electrical integrity and performance of the integrated circuit.

2. The flex dot wafer probe of claim 1 wherein each of said plurality of wafer contact pads further includes a protrusion depending therefrom, each said protrusion physically and electrically engaging corresponding contact elements of each integrated circuit to be tested in said scrubbing and nondeformable manner to provide enhanced electrical continuity therebetween for the electrical test signals to determine the electrical integrity and performance of the integrated circuit.

3. The flex dot wafer probe of claim 1 wherein each of said plurality of protrusions includes a planar contact pad formed on each said at least one tab of said film means.

4. The flex dot wafer probe of claim 1 further comprising reference mark means operative in combination with external edges of each integrated circuit to be tested for visually aligning said wafer contact pads of said wafer probe head means with corresponding contact elements of each integrated circuit chip to be tested wherein said wafer contact pads and the contact elements are aligned in physical and electrical registration for testing by relative coplanar shifting therebetween.

5. The flex dot wafer probe of claim 4 wherein the integrated circuit to be tested has external edges of predetermined dimensions, the contact elements of the integrated circuit having a known positional relation to the external edges thereof, and wherein said reference mark means comprises a triangular wafer alignment aperture having a first side, a second side projecting from said first side at approximately ninety degrees and a hypotenuse connecting said first and second sides, said first and second side having predetermined lengths, and wherein said first and second sides of said triangular wafer alignment aperture are aligned with corresponding edges of the integrated circuit to be tested and algebraic equations based upon said predetermined lengths of said first and second sides and the predetermined dimensions of the integrated circuit to be tested are solved to provide $\Delta X$, $\Delta Y$ and $\Delta \theta$ values to align said wafer contact pads and the contact elements in registration for testing by relative coplanar shifting therebetween.

6. The flex dot wafer probe of claim 4 wherein the integrated circuit to be tested has external edges of predetermined dimensions, the contact elements of the integrated circuit having a known positional relation to the external edges thereof, and wherein said reference mark means comprises at least a first, a second and a third wafer alignment apertures, said first wafer alignment aperture defining an apex of a right angle and said second and third wafer alignment apertures being disposed a predetermined distance from said first wafer alignment aperture along the defined right angle, wherein said first, second and third wafer alignment apertures are aligned with corresponding edges of the integrated circuit to be tested and algebraic equations based upon said predetermined distances and the predetermined dimensions of the integrated circuit to be tested are solved to provide $\Delta X$, $\Delta Y$ and $\Delta \theta$ values to align said wafer contact pads and the contact elements in registration for testing by relative coplanar shifting therebetween.

7. The flex dot wafer probe of claim 1 wherein said support member means is operative for controlling flexile movement of said film means with said wafer contact pads forcibly urged into physical and electrical engagement with corresponding contact elements of each integrated circuit to be tested in said scrubbing and nondeformable manner to provide enhanced electrical continuity therebetween for the electrical test signals.

8. The flex dot wafer probe of claim 2 wherein said support member means is operative for controlling flexile movement of said film means with said protrusions depending from said wafer contact pads forcibly urged into physical and electrical engagement with corresponding contact elements of each integrated circuit to be tested in said scrubbing and nondeformable manner to provide enhanced electrical continuity therebetween for the electrical test signals.

9. The flex dot wafer probe of claim 7 wherein said support member means includes resilient pressure pad means formed on said first and second major surfaces thereof for interacting with said film means for controlling flexile movement of said film means wherein said wafer contact pads are forcibly urged into physical and electrical engagement with corresponding contact elements of each integrated circuit to be tested in said scrubbing and nondeformable manner to provide enhanced electrical continuity therebetween for the electrical test signals, and wherein said resilient pressure pad means is aligned in registration with said protrusions and said wafer contact pads of said flex film means.

10. The flex dot wafer probe of claim 7 wherein said probe board means includes clearance openings to facilitate alignment and mating of said wafer probe head means in combination with said probe board means to form said flex dot wafer probe, and wherein said film means comprises
  a resilient bendable film having said base plane and said at least one extending from said base plane with the extremity thereof disposed approximately planar to said base plane, and wherein said plurality of protrusions are formed on each said at least one in said mirror-image pattern corresponding to said predetermined pattern of said interface contact pads, said plurality of wafer contact pads are formed on said base plane in said mirror-image pattern corresponding to the predetermined pattern of the contact elements of the integrated circuit to be tested, and said coplanar line conductor means is formed on said base plane and each said at least one tab to provide electrical continuity between said probe board means and the integrated chip to be tested, and
  said extremity of each said at least one and said base plane having alignment apertures formed therethrough, and wherein
  said support member means includes a plurality of alignment pins disposed in a predetermined pattern corresponding to said alignment apertures of said resilient bendable film, said alignment pins inserted in corresponding ones of said plurality of alignment apertures to mount said resilient bendable film in proper orientation to form said probe head means, and further wherein selected ones of said plurality of alignment pins are inserted in said clearance openings of said probe board means to properly align said wafer probe head means in combination therewith.

11. The flex dot wafer probe of claim 1 wherein said coplanar line conductor means formed on said film means comprises a plurality of line conductors formed in a predetermined configuration and disposed in a predetermined pattern to define a characteristic impedance of said flex dot wafer probe at a predetermined value.

12. For use in testing the electrical integrity of at least one integrated circuit formed on a semiconductor wafer, a probe test system including a flex dot wafer probe and external test equipment having signal transmitting elements disposed in a predetermined pattern for providing electrical test signals to test the electrical integrity and performance of each integrated circuit, and wherein each integrated circuit includes a predetermined pattern of contact elements adapted to receive the electrical test signals, said flex dot wafer probe comprising:
  a probe board for interfacing with the external test equipment, said probe board including
    interface contact pads having a predetermined pattern,
    means for electrically interfacing with the signal transmitting elements of the external test equipment, and
    means for electrically interconnecting said interface contact pads and said electrical interface means;
  a wafer probe head configured to be forcibly urged into physical and electrical engagement with said probe board and to interface with each integrated circuit to be tested, said wafer probe head including
    a resilient bendable film having a base plane and at least one tab extending from said base plane with the extremity thereof disposed approximately planar to said base plane,
    a plurality of protrusions formed on each said at least one tab in a mirror-image pattern corresponding to said predetermined pattern of said interface contact pads of said probe board, said plurality of protrusions being forcibly urged into physical and electrical engagement with said interface contact pads in a nondeformable manner to provide electrical continuity therebetween for the electrical test signals,
    a plurality of wafer contact pads formed on said base plane in a mirror-image pattern corresponding to said predetermined pattern of the contact elements of each integrated circuit to be tested, said wafer contact pads being forcibly urged into physical and electrical engagement with corresponding contact elements of each integrated circuit to be tested in a scrubbing and nondeformable manner to provide enhanced electrically continuity therebetween for the electrical test signals, and
    a plurality of coplanar line conductors formed on said base plane and said tabs to electrically interconnect corresponding ones of said plurality of protrusions and said plurality of wafer contact pads wherein the electrical test signals are transmitted from said interface contact pads to said plurality of protrusions, from said plurality of protrusions to said wafer contact pads via said plurality of coplanar line conductors and from said wafer contact pads to the contact elements of the integrated circuit to be tested to determine the electrical integrity and performance of the integrated circuit.

13. For use in testing the electrical integrity of at least one integrated circuit formed on a semiconductor wafer, a probe test system including a flex dot wafer probe and external test equipment having signal transmitting elements disposed in a predetermined pattern for providing electrical test signals to test the electrical integrity and performance of each integrated circuit, and wherein each integrated circuit includes a predetermined pattern of contact elements adapted to receive the electrical test signals, said flex dot wafer probe comprising:
  a probe board for interfacing with the external test equipment, said probe board including interface contact pads having a predetermined pattern, means for electrically interfacing with the signal transmitting elements of the external test equipment, and means for electrically interconnecting said interface contact pads and said electrical interface means;

a wafer probe head configured to be physically and electrically integrated with said probe board and to interface with each integrated circuit to be tested, said wafer probe head including a resilient bendable film having a base plane and tabs extending from said base plane with extremities thereof disposed approximately planar said base plane, a plurality of protrusions formed on said tabs in a mirror-image pattern corresponding to said predetermined pattern of said interface contact pads of said probe board, said plurality of protrusions physically and electrically engaging said interface contact pads in a nondeformable manner to provide electrical continuity therebetween for the electrical test signals, a plurality of wafer contact pads formed on said base plane in a mirror-image pattern corresponding to said predetermined pattern of the contact elements of each integrated circuit to be tested, said wafer contact pads physically and electrically engaging corresponding contact elements of each integrated circuit to be tested in a scrubbing and nondeformable manner to provide enhanced electrical continuity therebetween for the electrical test signals, a plurality of coplanar line conductors formed on said base plane and said tabs to electrically interconnect corresponding ones of said plurality of protrusions and said plurality of wafer contact pads wherein the electrical test signals are transmitted from said interface contact pads to said plurality of protrusions, from said plurality of protrusions to said wafer contact pads via said plurality of coplanar line conductors and from said wafer contact pads to the contact elements of the integrated circuit to be tested to determine the electrical integrity and performance of the integrated circuit, and a support member having first and second major surfaces, said film being mounted on said support member to have said base plane adjacent said first major surface and said tabs adjacent said second major surface, said support member further including resilient pressure pads disposed on said first and second major surfaces in registration with said plurality of wafer contact pads and said plurality of protrusions, respectively, to control flexile movement of said film wherein said plurality of wafer contact pads engage corresponding contact elements of each integrated circuit to be tested in said scrubbing and nondeformable manner to provide enhanced electrical continuity therebetween for the electrical test signals and said plurality of protrusions engage corresponding interface contact pads of said probe board said nondeformable manner to provide electrical continuity therebetween for the electrical test signals and said plurality of protrusions.

14. The flex dot wafer probe of claim 12 wherein each of said plurality of protrusions includes a planar contact pad formed on said first surface of said film means.

15. The flex dot wafer probe of claim 12 wherein each of said plurality of wafer contact pads further includes a protrusion depending therefrom, each said protrusion physically and electrically engaging corresponding contact elements of each integrated circuit to be tested in said scrubbing and nondeformable manner to provide enhanced electrical continuity therebetween for the electrical test signals to determine the electrical integrity and performance of the integrated circuit.

16. The flex dot wafer probe of claim 13 wherein the integrated circuit to be tested has external edges of predetermined dimensions, the contact elements of the integrated circuit having a known positional relation to the external edges thereof, said support member has a central aperture extending therethrough, and said probe board includes an orientation aperture extending therethrough, and wherein said wafer probe head further comprises a triangular wafer alignment aperture having a first side, a second side projecting from said first side at approximately ninety degrees and a hypotenuse connecting said first and second sides, said first and second side having predetermined lengths, and wherein said first and second sides of said triangular wafer alignment aperture are aligned with corresponding edges of the integrated circuit to be tested and algebraic equations based upon said predetermined lengths of said first and second sides and the predetermined dimensions of the integrated circuit to be tested are solved to provide $\Delta X$, $\Delta Y$ and $\Delta \theta$ values to align said wafer contact pads and the contact elements in registration for testing by relative coplanar shifting therebetween, said orientation aperture, said triangular alignment aperture and said central aperture being coaxially aligned along the Z-axis of said flex dot wafer probe to provide an unobstructed line-of-sight of the integrated circuit to be tested.

17. The flex dot wafer probe of claim 13 wherein the integrated circuit to be tested has external edges of predetermined dimensions, the contact elements of the integrated circuit having a known positional relation to the external edges thereof, said support member has a central aperture extending therethrough, and said probe board includes an orientation aperture extending therethrough, and wherein said wafer probe head has at least first, second and third wafer alignment apertures, said first wafer alignment aperture defining an apex of a right angle, and said second and third wafer alignment apertures being disposed a predetermined distance from said first wafer alignment aperture along the defined right angle, wherein said first, second and third wafer alignment apertures are aligned with corresponding edges of the integrated circuit to be tested and algebraic equations based upon said predetermined distances and the predetermined dimensions of the integrated circuit to be tested are solved to provide $\Delta X$, $\Delta Y$ and $\Delta \theta$ values to align said wafer contact pads and the contact elements in registration for testing by relative coplanar shifting therebetween, said orientation aperture, said triangular alignment aperture and said central aperture being coaxially aligned along the Z-axis of said flex dot wafer probe to provide an unobstructed line-of-sight of the integrated circuit to be tested.

18. The flex dot wafer probe of claim 12 wherein said plurality of coplanar line conductors have a predetermined configuration and are disposed in a predetermined pattern to define a characteristic impedance of said flex dot wafer probe at a predetermined value.

19. A method for testing the electrical integrity and performance of at least one integrated circuit formed on a semiconductor wafer using external test equipment having signal transmitting elements disposed in a predetermined pattern to provide electrical test signals to test the electrical integrity and performance of each integrated circuit, and wherein each integrated circuit to be tested includes a predetermined pattern of contact elements adapted to receive the electrical test signals, comprising the steps of:

forming a flex dot wafer probe for electrically interfacing between the external test equipment and the integrated circuit to be tested, said flex dot wafer probe including a probe board for interfacing with the external test equipment, said probe board having an orientation aperture formed therethrough and further including interface contact pads having a predetermined pattern, means for electrically interfacing with the signal transmitting elements of the external test equipment, and means for electrically interconnecting said interface contact pads and said electrical interface means, a wafer probe head physically and electrically integrated with said probe board and interfacing with each integrated circuit to be tested, said wafer probe head including a support member having first and second major surfaces and a central aperture formed therethrough, a resilient bendable film having a base plane and tabs extending from said base plane with extremities thereof disposed approximately planar said base plane and wafer alignment means formed therethrough for aligning said flex dot wafer probe with the integrated circuit to be tested, said wafer alignment means in combination with said orientation aperture and said central aperture forming an unobstructed line-of-sight through said flex dot wafer probe along the Z-axis thereof, said film being mounted on said support member to have said base plane adjacent said first major surface and said tabs adjacent said second major surface, a plurality of protrusions formed on said tabs in a mirror-image pattern corresponding to said predetermined pattern of said interface contact pads of said probe board, said plurality of protrusions physically and electrically engaging said interface contact pads in a nondeformable manner to provide electrical continuity therebetween for the electrical test signals, a plurality of wafer contact pads formed on said base plane in a mirror-image pattern corresponding to said predetermined pattern of the contact elements of each integrated circuit to be tested, said wafer contact pads physically and electrically engaging corresponding contact elements of each integrated circuit to be tested in a scrubbing and nondeformable manner to provide enhanced electrical continuity therebetween for the electrical test signals, and a plurality of coplanar line conductors formed on said base plane and said tabs to electrically interconnect corresponding ones of said plurality of protrusions and said plurality of wafer contact pads;

aligning said flex dot wafer probe with the integrated circuit to be tested by
positioning said wafer alignment means along edges of the integrated circuit to be tested,
solving equations based upon known dimensions of said wafer alignment means, said wafer contact pads, the edges of the integrated circuit to be tested and the contact elements of the integrated circuit to be tested to generate $\Delta X$, $\Delta Y$ and $\Delta \theta$ values to align said wafer contact pads and the contact elements in registration for testing, and
effecting relative coplanar shifting between said wafer contact pads and the contact elements of the integrated circuit to be tested for registration thereof;

effecting Z-axis movement of said flex dot wafer probe to bring said wafer contact pads and the contact elements of the integrated circuit to be tested in physical and electrical engagement in a nondeformable manner to provide electrical continuity therebetween for the electrical test signals;

effecting relative micromovement between said physically engaged wafer contact pads and the contact elements to scrub oxide films therefrom to enhance the electrical continuity therebetween; and providing electrical test signals from the external test equipment to the signal transmitting elements, the electrical test signals being transmitted to said interface contact pads, from said interface contact pads to said plurality of protrusions, from said plurality of protrusions to said wafer contact pads via said plurality of coplanar line conductors and from said wafer contact pads to the contact elements of the integrated circuit to be tested to determine the electrical integrity and performance of each integrated circuit to be tested.

* * * * *

UNITED STATES PATENT AND TRADEMARK OFFICE
CERTIFICATE OF CORRECTION

PATENT NO. : 4,899,099
DATED : February 6, 1990
INVENTOR(S) : David W. Mendenhall et al It is certified that error appears in the above-indentified patent and that said Letters Patent is hereby corrected as shown below:

Column 3, line 68, "directions θ" should read --θ directions--.

Column 8, line 58, "illustrated as" should read --as illustrated--.

Column 11, line 25, "planes" should read --plane--.

Column 13, line 24, "one extending" should read --one tab extending--.

Column 13, line 27, "at least one" should read --at least one tab--.

Column 13, line 39, "at least one and" should read --at least one tab and--.

Signed and Sealed this

Ninth Day of August, 1994

Attest:

BRUCE LEHMAN

*Attesting Officer*          *Commissioner of Patents and Trademarks*